US012217955B2

(12) United States Patent
Liu et al.

(10) Patent No.: US 12,217,955 B2
(45) Date of Patent: Feb. 4, 2025

(54) METHOD FOR ETCHING FEATURES USING A TARGETED DEPOSITION FOR SELECTIVE PASSIVATION

(71) Applicant: Lam Research Corporation, Fremont, CA (US)

(72) Inventors: Wenchi Liu, Milpitas, CA (US); Zhongkui Tan, Fremont, CA (US); Juan Valdivia, Fremont, CA (US); Colin Richard Rementer, Los Angeles, CA (US); Qing Xu, Fremont, CA (US); Yoko Yamaguchi, Union City, CA (US); Yoshie Kimura, Castro Valley, CA (US); Hua Xiang, Palo Alto, CA (US); Yasushi Ishikawa, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 425 days.

(21) Appl. No.: 17/619,979

(22) PCT Filed: Jul. 1, 2020

(86) PCT No.: PCT/US2020/040432
§ 371 (c)(1),
(2) Date: Dec. 16, 2021

(87) PCT Pub. No.: WO2021/003224
PCT Pub. Date: Jan. 7, 2021

(65) Prior Publication Data
US 2022/0301853 A1     Sep. 22, 2022

Related U.S. Application Data

(60) Provisional application No. 62/870,271, filed on Jul. 3, 2019.

(51) Int. Cl.
*H01L 21/02* (2006.01)
*C23C 16/04* (2006.01)
(Continued)

(52) U.S. Cl.
CPC ........ *H01L 21/0228* (2013.01); *C23C 16/045* (2013.01); *C23C 16/401* (2013.01);
(Continued)

(58) Field of Classification Search
CPC .......... H01L 21/0228; H01L 21/02164; H01L 21/02208; H01L 21/02274;
(Continued)

(56) References Cited

U.S. PATENT DOCUMENTS

| 7,560,361 B2 | 7/2009 | Frank et al. |
| 9,607,853 B2 | 3/2017 | Jeon et al. |

(Continued)

FOREIGN PATENT DOCUMENTS

| CN | 104641282 A | * 5/2015 | .......... C09K 19/408 |
| JP | 2004-179649 | 6/2004 | |

(Continued)

OTHER PUBLICATIONS

International Search Report from International Application No. PCT/US2020/040432 dated Oct. 14, 2020.
(Continued)

*Primary Examiner* — Phuc T Dang
(74) *Attorney, Agent, or Firm* — Beyer Law Group LLP

(57) ABSTRACT

A method for patterning a stack having a mask with a plurality of mask features is provided. A targeted deposition is provided, wherein the targeted deposition comprises a plurality of cycles, wherein each cycle comprises flowing a precursor to deposit a layer of precursor and targeted curing the layer of precursor, comprising flowing a curing gas, flowing a modification gas, forming a plasma from the
(Continued)

curing gas and modification gas, and exposing the layer of precursor to the plasma providing a targeted curing, wherein plasma from the curing gas cures first portions of the layer of precursor and plasma from the modification gas modifies second portions of the layer of precursor, wherein the modification of the second portion reduces curing of the layer of precursor of the second portions of the layer of precursor. The stack is etched through the targeted deposition.

20 Claims, 4 Drawing Sheets

(51) Int. Cl.
    *C23C 16/40*     (2006.01)
    *C23C 16/455*     (2006.01)
    *C23C 16/56*     (2006.01)
    *H01J 37/32*     (2006.01)
    *H01L 21/3213*     (2006.01)

(52) U.S. Cl.
    CPC .. *C23C 16/45536* (2013.01); *C23C 16/45553* (2013.01); *C23C 16/56* (2013.01); *H01J 37/32449* (2013.01); *H01L 21/02164* (2013.01); *H01L 21/02208* (2013.01); *H01L 21/02274* (2013.01); *H01L 21/32137* (2013.01); *H01J 37/32082* (2013.01); *H01J 2237/334* (2013.01)

(58) Field of Classification Search
    CPC ......... H01L 21/32137; H01L 2237/334; C23C 16/045; C23C 16/401; C23C 16/45536; C23C 16/56
    USPC .......................................................... 438/700
    See application file for complete search history.

(56) References Cited

U.S. PATENT DOCUMENTS

| | | | |
|---|---|---|---|
| 2002/0039843 | A1 | 4/2002 | Ikeda et al. |
| 2008/0150138 | A1* | 6/2008 | Bright ............... H01L 21/76843 257/E23.169 |
| 2013/0344699 | A1 | 12/2013 | Chiba |
| 2016/0314981 | A1* | 10/2016 | Yoon ................. H01L 21/32136 |
| 2017/0148923 | A1 | 5/2017 | Balakrishnan et al. |
| 2017/0178920 | A1* | 6/2017 | Dole ................. H01J 37/32137 |
| 2017/0207088 | A1 | 7/2017 | Kwon et al. |

FOREIGN PATENT DOCUMENTS

| | | | |
|---|---|---|---|
| JP | 2006-054465 | 2/2006 | |
| KR | 10-0838391 | 6/2008 | |
| KR | 2016-0006029 | 1/2016 | |
| WO | WO-0048236 A1 * | 8/2000 | ............. G02B 6/124 |
| WO | WO-2006135369 A1 * | 12/2006 | ....... H01L 21/02126 |

OTHER PUBLICATIONS

Written Opinion from International Application No. PCT/US2020/040432 dated Oct. 14, 2020.
Taiwanese Office Action from Taiwanese Application No. 109122501 dated Nov. 20, 2023 with Machine Translation.
Korean Office Action from Korean Application No. 10-2022-7003571 dated Jun. 10, 2024 with Machine Translation.
Japanese Office Action from Japanese Application No. 2021-577240 dated Jun. 4, 2024.
Taiwanese Notice of Allowance Translation from Taiwanese Application No. 109122501 dated May 20, 2024.
Korean Reissued Office Action from Korean Application No. 10-2022-7003571 dated Jul. 23, 2024 with Machine Translation.

\* cited by examiner

METHOD FOR ETCHING FEATURES USING A TARGETED DEPOSITION FOR SELECTIVE PASSIVATION

CROSS-REFERENCE TO RELATED APPLICATION

This application claims the benefit of priority of U.S. Application No. 62/870,271, filed Jul. 3, 2019, which is incorporated herein by reference for all purposes.

BACKGROUND

The background description provided here is for the purpose of generally presenting the context of the present disclosure. Anything described in this background section, and potentially aspects of the written description, are not expressly or impliedly admitted as prior art with respect to the present application.

The present disclosure relates to the formation of semiconductor devices. More specifically, the disclosure relates to the formation of semiconductor devices requiring etching features.

During semiconductor wafer processing, a stack below a mask may be etched. A pattern may be transferred from the mask to one or more layers of the stack. Low-temperature ALD (atomic layer deposition) of silicon oxide ($SiO_2$) over patterned organic materials, photoresist or spin on carbon (SOC), is used to provide sidewall protection for etching features. Oxygen ($O_2$) plasma is one method used for oxidation of silicon (Si) containing precursors. ALD provides uniform deposition. Such a uniform deposition is not always the most suitable for forming high aspect ratio features.

SUMMARY

To achieve the foregoing and in accordance with the purpose of the present disclosure, a method for patterning a stack having a mask with a plurality of mask features is provided. A targeted deposition is provided, wherein the targeted deposition comprises a plurality of cycles, wherein each cycle comprises flowing a precursor to deposit a layer of precursor and targeted curing the layer of precursor, comprising flowing a curing gas, flowing a modification gas, forming a plasma from the curing gas and modification gas, and exposing the layer of precursor to the plasma providing a targeted curing, wherein plasma from the curing gas cures first portions of the layer of precursor and plasma from the modification gas modifies second portions of the layer of precursor, wherein the modification of the second portion reduces curing of the layer of precursor of the second portions of the layer of precursor. The stack is etched through the targeted deposition.

In another manifestation, a semiconductor device is formed. A targeted deposition is provided, wherein the targeted deposition comprises a plurality of cycles, wherein each cycle comprises flowing a precursor to deposit a layer of precursor and targeted curing the layer of precursor, comprising flowing a curing gas, flowing a modification gas, forming a plasma from the curing gas and modification gas, and exposing the layer of precursor to the plasma providing a targeted curing, wherein plasma from the curing gas cures first portions of the layer of precursor and plasma from the modification gas modifies second portions of the layer of precursor, wherein the modification of the second portion reduces curing of the layer of precursor of the second portions of the layer of precursor. The stack is etched through the targeted deposition.

In another manifestation, an apparatus for etching features in a stack is provided. A plasma chamber is provided. A substrate support is within the plasma chamber. A delivery system delivers fluids into the plasma chamber. A fluid source provides the fluid to the delivery system. The fluid source comprises an etch fluid source, a precursor fluid source, a curing fluid source, and a modification fluid source. An electrode provides RF power in the plasma chamber. At least one RF generator is provided. A controller is controllably connected to the fluid source and the at least one RF generator. The controller comprises at least one processor and computer readable media, comprising computer readable code for effecting etching a stack. The computer readable code comprises computer readable code for partially etching the stack, computer readable code for providing a targeted deposition, wherein the targeted deposition, comprises a plurality of cycles, wherein each cycle comprises computer readable code for flowing a precursor from the precursor fluid source to deposit a layer of precursor and computer readable code for targeted curing the layer of precursor, comprising computer readable code for flowing a curing gas from the curing fluid source, computer readable code for flowing a modification gas from the modification fluid source, computer readable code for forming a plasma from the curing gas and modification gas, and computer readable code for exposing the layer of precursor to the plasma providing a targeted curing, wherein plasma from the curing gas cures first portions of the layer of precursor and plasma from the modification gas modifies second portions of the layer of precursor, wherein the modification of the second portion reduces curing of the layer of precursor of the second portions of the layer of precursor, and computer readable code for etching the stack through the targeted deposition.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

Low-temperature ALD (atomic layer deposition) of silicon oxide ($SiO_2$) over patterned organic materials, photoresist or spin on carbon (SOC), is used to provide sidewall protection for etching features. Oxygen ($O_2$) plasma is one method used for oxidation of silicon (Si) containing precursors. ALD provides uniform deposition. Such a uniform deposition is not always the most suitable for forming high aspect ratio features.

Figure 1:
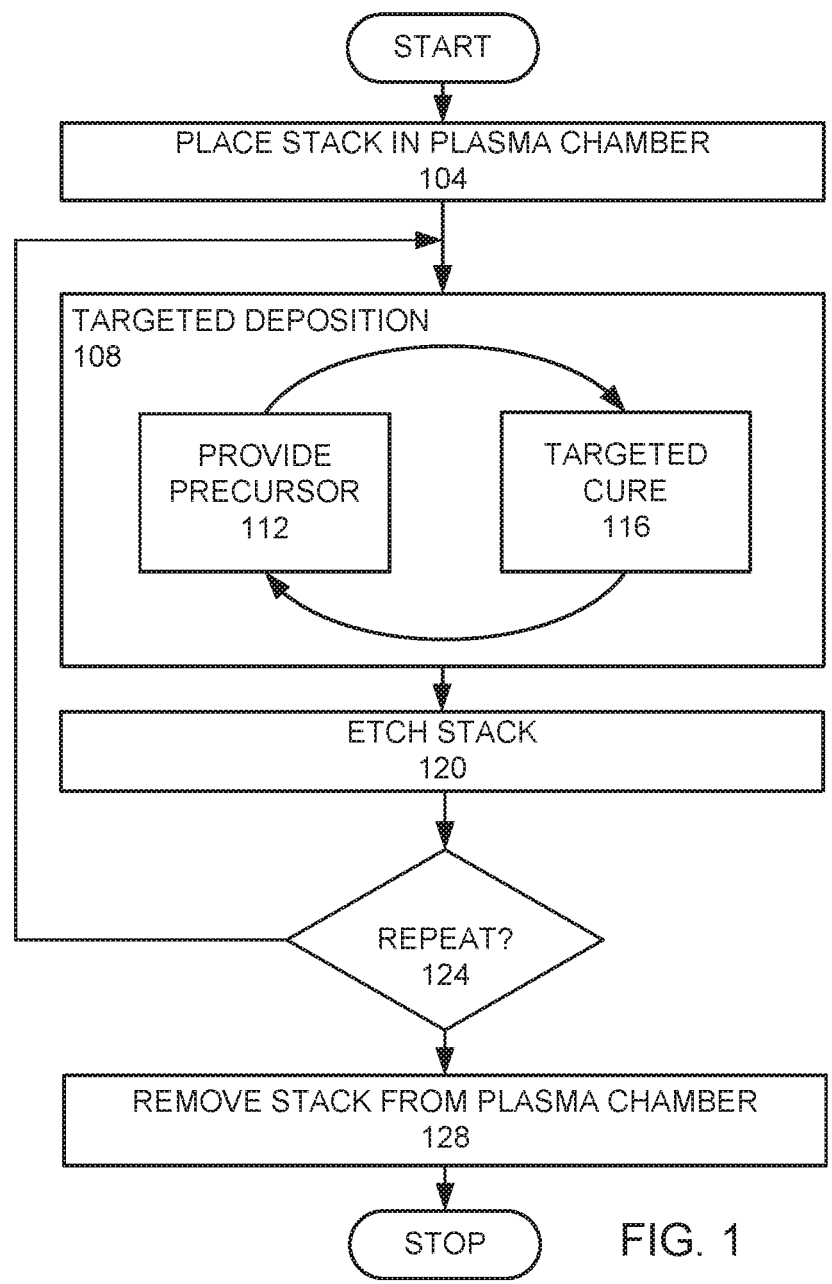
FIG. 1 is a high level flow chart of a process that may be used in an embodiment.
Figure 2A:
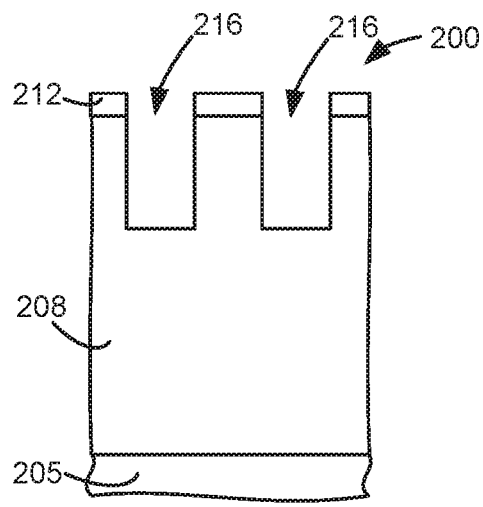
FIGS. 2A-E are schematic cross-sectional views of a stack processed according to an embodiment.

To facilitate understanding, FIG. 1 is a high level flow chart of an embodiment. A stack with a mask with mask features is placed on a substrate support in a plasma chamber (step 104). FIG. 2A is a cross-sectional view of a stack 200 with a substrate 205. The substrate 205 is disposed below an intermediate layer 208. The intermediate layer 208 is disposed below a mask 212. In this example, the mask 212 is a patterned organic mask, such as a photoresist mask, with mask features. One or more layers may be disposed between the intermediate layer 208 and the mask 212. The intermediate layer 208 has been partially etched. One or more layers may be disposed between the intermediate layer 208 and the substrate 205. The cyclical process described below or another process may be used to partially etch features 216. The cyclical process described below is shown with partially etched features in order to more clearly illustrate the targeted deposition process. The figures are not drawn to scale in order to better illustrate various features. For example, in some embodiments height to width aspect ratios of features 216 may be at least 100 to 1. However, the features 216 are drawn much wider in order to better illustrate subsequently deposited layers.

A targeted deposition is provided (step 108) to deposit a targeted deposition comprising at least one cycle of providing a precursor (step 112) and a targeted curing of the precursor (step 116). The precursor is provided to the features 216 (step 112). In this embodiment, a liquid silicon containing precursor is vaporized and delivered in vapor form into a plasma chamber, to dose the features 216 to saturation, forming a layer of precursor over the features 216. Once the features 216 are dosed with the precursor, the delivery of the precursor vapor is stopped. The precursor is then subjected to a targeted cure (step 116). In an embodiment, the targeted cure (step 116) is accomplished by subjecting the stack 200 to a targeted flash process. The targeted flash process provides a curing gas of 1000 standard cubic centimeters per minute (sccm) to 2000 sccm oxygen ($O_2$) and provides a modification gas of 10 sccm to 25 sccm of octafluorocyclobutane ($C_4F_8$). In this example, the curing gas and modification gas are formed into a plasma by providing a radio frequency (RF) power of 2500 watts 13.56 megahertz (MHz). A pressure of 20 millitorrs (mTorr) to 100 mTorr is provided. The targeted flash is provided from between about 0.5 seconds and about 4 seconds. The targeted flash forms a silicon oxide monolayer on first portions of the features 216. On second portions of the features, the formation of the targeted deposition is reduced or eliminated. Once the targeted flash operation is completed, the plasma chamber is purged. The cycle may then be repeated. In this embodiment, the providing the precursor (step 112) and the targeted curing (step 116) are sequential and do not overlap. In this example, a purge may be used to prevent the overlapping of the providing the precursor (step 112) and the targeted curing (step 116).

In an embodiment of the providing the precursor, any suitable liquid precursor capable of forming a conformal atomic layer can be used. By way of non-limiting example, the liquid precursor can have a composition of the general type $C(x)H(y)N(z)O(a)Si(b)$. In some embodiments, the liquid precursor is a silicon containing polymer with a silicon functional group that may have one of the following compositions: 1-triaminosilylhexane ($C_6H_{19}N_3Si$), bis(t-butylamino)silane ($C_8H_{22}N_2Si$), 3-aminopropyltriethoxysilane ($C_9H_{23}NO_3Si$), and tri-t-butoxysilanol ($C_{12}H_{28}O_4Si$). In this example, the providing of the precursor is plasmaless. The precursor has a silicon function group. The silicon functional group forms a monolayer on the features 216 since the precursor does not attach to another precursor.

Figure 2B:
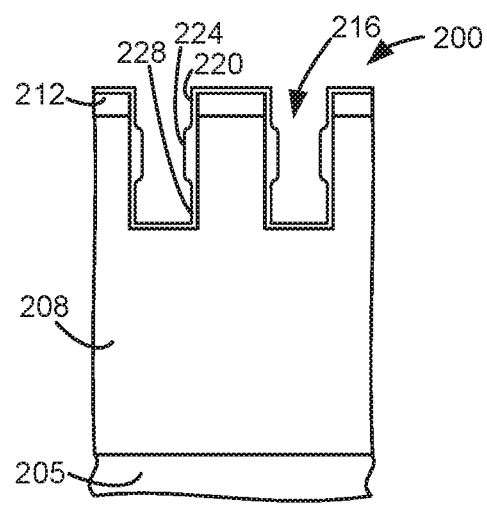

FIG. 2B is a cross-sectional view of the stack 200 after a plurality of cycles of the targeted deposition (step 108). A targeted deposition is formed over sidewalls of the features 216. In this example, the targeted deposition has thinner upper regions 220, thicker middle regions 224, and thinner bottom regions 228. In an example, the targeted deposition has an upper region 220 with a thickness of about 1 to 2 nm, a middle region 224 with a thickness of about 2-4 nanometer (nm), and a bottom region 228 with a thickness of about 1 nm. In this example, the first portions are the middle region 224 and the second portions are the upper regions 220 and bottom regions 228. The thickness of the targeted deposition is not drawn to scale, in order to better illustrate the targeted deposition.

Figure 2C:
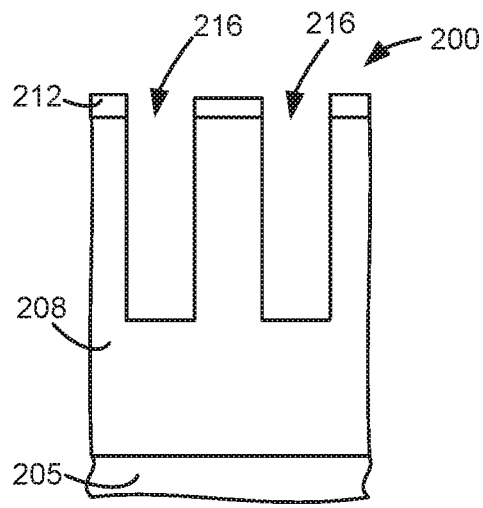

The intermediate layer 208 is then etched with respect to the mask 212 (step 120). In this example, the intermediate layer 208 is polysilicon. FIG. 2C is a cross-sectional view of the stack 200 after the intermediate layer 208 is selectively etched with respect to the mask 212. In this example, the features 216 have been etched deeper and the targeted deposition has been etched away.

Figure 2D:
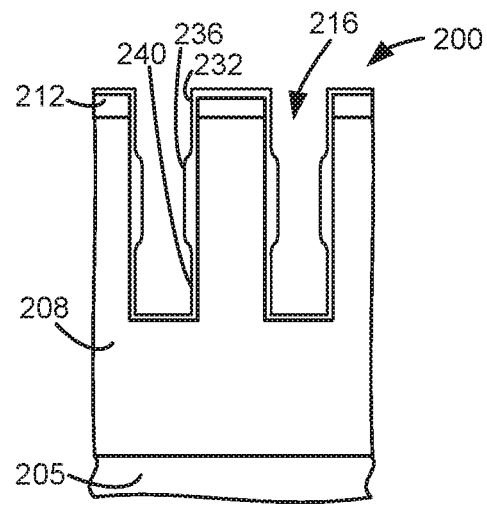

In this example, the targeted deposition (step 108) and the intermediate layer etch (step 120) are repeated (step 124) at least one more cycle. The targeted deposition (step 108) deposits another targeted deposition. FIG. 2D is a cross-sectional view of the stack 200 after a plurality of cycles of the targeted deposition (step 108) deposits another targeted deposition with another thinner upper region 232, another thicker middle region 236, and another thinner bottom region 240.

Figure 2E:
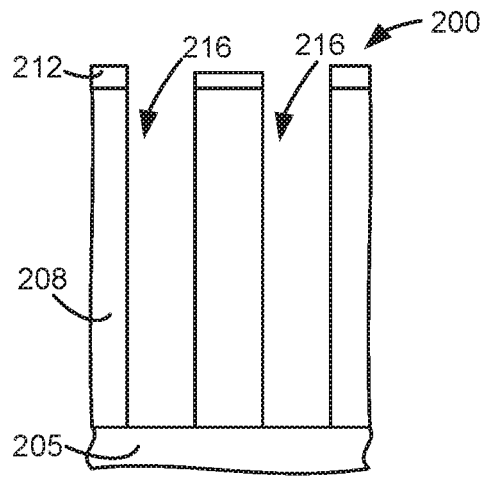

The process is continued and the cycles are repeated until the features 216 are completed. FIG. 2E is a cross-sectional view of the stack 200 after the etching of the features 216 is completed. Additional processes may be provided. For example, the mask 212 may be removed. Then, the stack 200 is removed from the plasma chamber (step 128).

The targeted deposition provides a nonconformal deposition, where thicknesses at various locations of the etch feature may be selectively tailored. Various embodiments provide different controls for determining where the thicker regions and thinner regions of the targeted deposition are located. Process parameters may be used as controls, such as gas flow rates, pressure, side tuning gases, process times, temperature, and electrical bias. Various embodiments allow for the etching of high aspect ratio features. In the specification and claims, high aspect ratio features are defined as having a height to width aspect ratio of at least 100 to 1. More specifically, the high aspect ratio features have an aspect ratio of at least 200 to 1. Various embodiments may provide high aspect ratio features that are channels or holes. In some embodiments, the thickest part of the targeted deposition would be deposited over the weakest areas of features, such as joint areas for a punch process. Various embodiments may be used for punch processes, shallow trench isolation, and carbon mask opening. In other embodiments, the targeted deposition may be used in the formation of lower aspect ratio features.

By combining a dry etch chemistry with an ALD chemistry in a single step, the targeted deposition is provided. In various embodiments, the modification gas comprises a halogen containing gas. More specifically, the modification gas comprises fluorocarbons. In various embodiments, the modification gas comprises one or more of $C_4F_8$, hexafluorobutadiene ($C_4F_6$), chlorine ($Cl_2$), hydrogen bromide (HBr), carbon tetrafluoride ($CF_4$), fluoromethane ($CH_3F$), or sulfur hexafluoride ($SF_6$). In other embodiments, a metal oxide may be used for the targeted deposition. In such embodiments, a metal containing precursor forms a metal containing layer, such as a metal containing precursor monolayer. A curing gas and a modification gas are provided and formed into a plasma to provide a targeted metal oxide deposition. In other embodiments, silicon nitride or a metal nitride may be used for the targeted deposition. In other embodiments, silicon oxynitride or metal oxynitride may be used for the targeted deposition. For forming the nitride or oxynitride the precursor layer is nitrogenated. Therefore, in various embodiments, the curing of the precursor layer at least one of oxidizes or nitrogenates portions of the precursor layer.

Without being bound by theory, it is believed that by adding an etchant during the targeted curing and by using tuning parameters, the modification gas may be used to selectively etch targeted areas of the layer of precursor to reduce the deposition at the targeted areas.

In various embodiments, the targeted curing of the monolayer may be done by applying RF power to the plasma chamber along with a curing gas and modification gas to perform a plasma flash process (or oxygen ($O_2$) plasma cure), the plasma flash process being performed for a period of time that is between about 0.2 second and about 4 seconds, and the RF power is applied at a power level that is between about 200 watts and about 3,000 watts. The $O_2$ plasma cure converts the Si-containing precursor into $SiO_2$.

In other embodiments, the targeted deposition may deposit thicker deposition on the sidewalls at the bottom of the features 216. In other embodiments, the targeted deposition has minimal deposition on horizontal surfaces. Various embodiments may provide a targeted deposition that does not deposit on the bottoms of the features 216. Various embodiments may provide targeted depositions that do not deposit at the tops of the features 216.

The above embodiments are performed in-situ in the same chamber, without moving the chuck or removing the stack from the chuck. Such embodiments provide faster and less expensive throughput. In addition, thinner layers may be applied for each cycle, since the in-situ process allows for a greater number of cycles. A greater number of cycles allows for improved feature shape.

Figure 3:
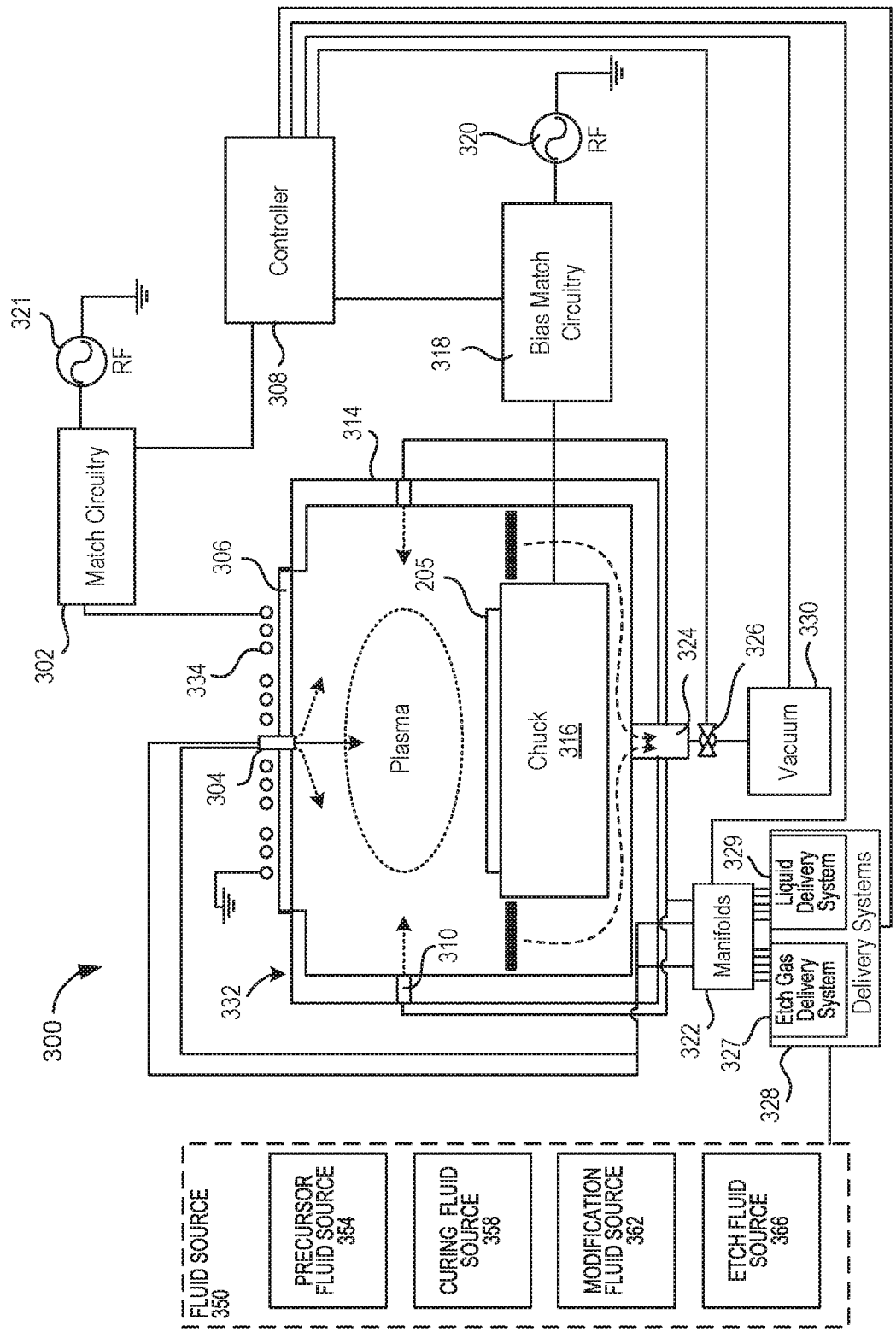
FIG. 3 is a schematic view of a plasma processing chamber that may be used in practicing an embodiment.

FIG. 3 schematically illustrates an example of a plasma processing system 300. The plasma processing system 300 may be used to perform the process of an embodiment. The system includes a plasma chamber 332 that includes a chamber body 314, a chuck 316, and a dielectric window 306. The plasma chamber 332 includes a processing region with the dielectric window 306 disposed over the processing region. The chuck 316 can be an electrostatic chuck for supporting a substrate 205 and is disposed in the chamber below the processing region. A transformer coupled plasma (TCP) coil 334 is disposed over the dielectric window 306 and is connected to match circuitry 302. The TCP coil 334 is an electrode to provide power through the dielectric window 306. The match circuitry 302 is connected to a plasma RF generator 321.

The system includes a bias RF generator 320. The RF generator 320 may be defined as one or more generators. If multiple generators are provided, different frequencies can be used to achieve various tuning characteristics. A bias match 318 is coupled between the bias RF generators 320 and a conductive plate of the assembly that defines the chuck 316. The chuck 316 also includes electrostatic electrodes to enable the chucking and dechucking of the wafer. Broadly, a filter and a direct current (DC) clamp power supply can be provided. Other control systems for lifting the wafer off of the chuck 316 can also be provided.

A first gas injector 304 provides two different channels to inject two separate streams of process gases or liquid precursor (in vapor form) into the plasma chamber 332 from the top of the plasma chamber 332. It should be appreciated that multiple gas supplies may be provided for supplying different gases to the plasma chamber 332 for various types of operations, such as process operations on wafers, waferless auto-cleaning (WAC) operations, and other operations. A second gas injector 310 provides another gas stream that enters the plasma chamber 332 through the side instead of from the top.

Delivery systems 328 includes, in one embodiment, an etch gas delivery system 327 and a liquid delivery system 329. Manifolds 322 are used for selecting, switching, and/or mixing outputs from the respective delivery systems. As will be described in more detail below, the etch gas delivery system is configured to output etchant gases that are optimized to etch one or more layers of materials of a substrate. The manifolds 322 are further optimized, in response to control from the controller 308, to perform targeted deposition. A vacuum pump 330 is connected to the plasma chamber 332 to enable vacuum pressure control and removal of gaseous byproducts from the plasma chamber 332 during operational plasma processing. A valve 326 is disposed between exhaust 324 and the vacuum pump 330 to control the amount of vacuum suction being applied to the plasma chamber 332.

A fluid source 350 may be used to deliver various fluids to the delivery system 328. A fluid may be a gas or a liquid. In this embodiment, the fluid source 350 comprises a precursor fluid source 354, a curing fluid source 358, a modification fluid source 362, and an etch fluid source 366. In various embodiments, the fluid source 350 may be a single unit or more than one individual unit. For example, the precursor fluid source 354 may provide a liquid vapor and therefore be separate from the curing fluid source 358, the modification fluid source 362, and the etch fluid source 366 that provide gases.

Figure 4:
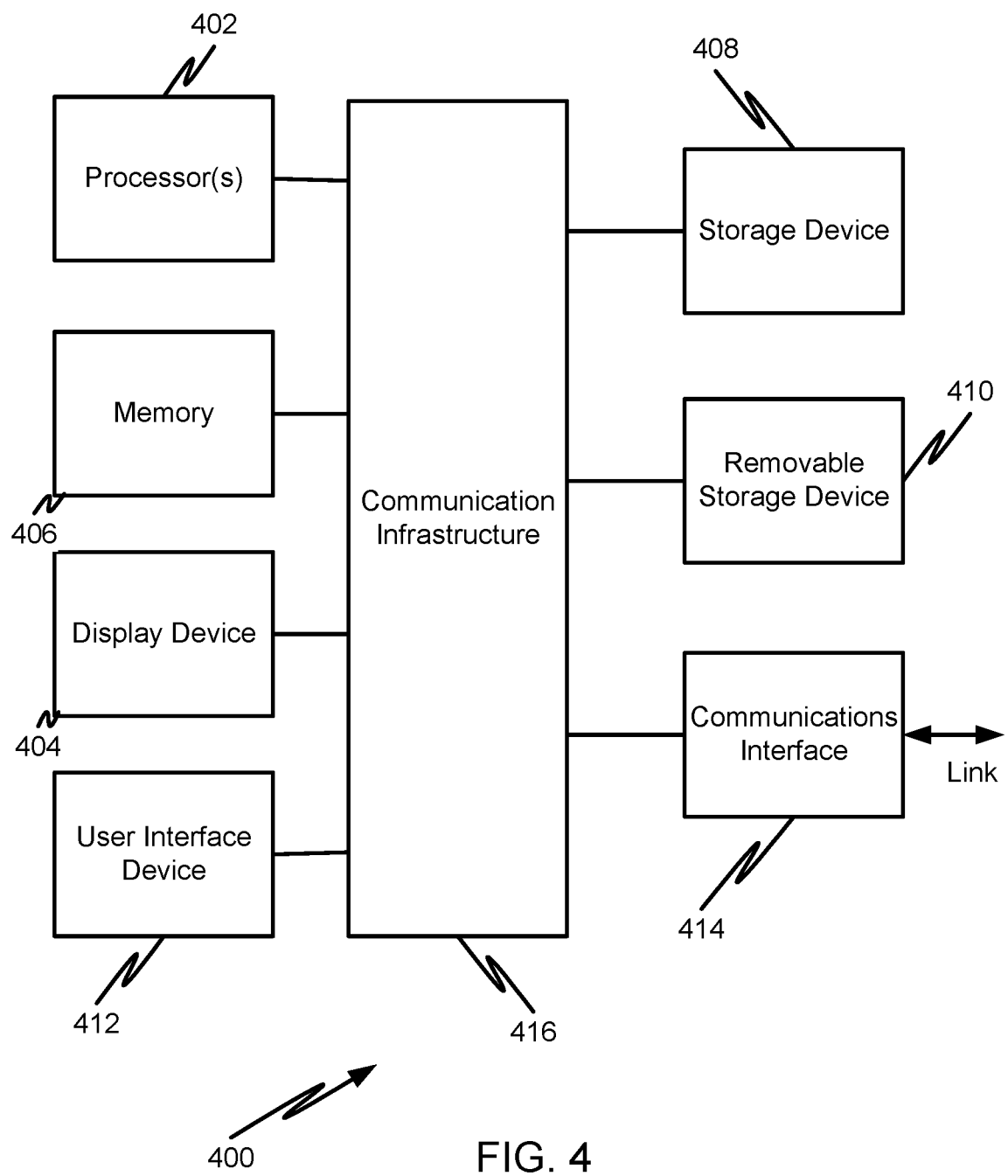
FIG. 4 illustrates a computer system, which is suitable for implementing a controller used in embodiments.

FIG. 4 is a high level block diagram showing a computer system 400, which is suitable for implementing the controller 308 used in an embodiment. The computer system may have many physical forms ranging from an integrated circuit, a printed circuit board, and a small handheld device up to a huge supercomputer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer readable code include machine code, such as produced by a compiler, and files containing higher level code that are executed by a computer using an interpreter. Computer readable media may also be computer readable code transmitted by a computer data signal embodied in a carrier wave and representing a sequence of instructions that are executable by a processor.

While this disclosure has been described in terms of several preferred embodiments, there are alterations, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A method for patterning a stack having a mask with a plurality of mask features, comprising:
   providing a targeted deposition, wherein the targeted deposition, comprises a plurality of cycles, wherein each cycle comprises:
      flowing a precursor to deposit a layer of precursor; and
      targeted curing the layer of precursor, comprising;
         flowing a curing gas;
         flowing a modification gas;
         forming a plasma from the curing gas and modification gas; and
         exposing the layer of precursor to the plasma providing a targeted curing, wherein plasma from the curing gas cures first portions of the layer of precursor and plasma from the modification gas modifies second portions of the layer of precursor, wherein the modification of the second portion reduces curing of the layer of precursor of the second portions of the layer of precursor; and
   etching the stack through the targeted deposition.

2. The method, as recited in claim 1, wherein the precursor deposits at least one of a silicon containing layer or a metal containing layer.

3. The method, as recited in claim 2, wherein the curing the first portions of the layer of precursor at least one of oxidizes or nitrogenates the first portions of the layer of precursor.

4. The method, as recited in claim 1, wherein the modification gas comprises a halogen containing gas.

5. The method, as recited in claim 1, wherein the modification gas comprises at least one of $C_4F_8$, $C_4F_6$, $Cl_2$, HBr, $CF_4$, or $SF_6$.

6. The method, as recited in claim 1, wherein the precursor comprises a silicon containing polymer.

7. The method, as recited in claim 1, wherein the precursor comprises a polymer with a silicon functional group.

8. The method, as recited in claim 1, wherein the flowing the precursor is plasmaless.

9. The method, as recited in claim 1, wherein the mask is made of a carbon containing material.

10. The method, as recited in claim 1, wherein the etching the stack etches features with a height to width aspect ratio of greater than 100 to 1.

11. The method, as recited in claim 1, wherein providing the targeted deposition and the etching the stack are cyclically provided for a plurality of cycles.

12. The method, as recited in claim 1, wherein the providing the targeted deposition and the etching the stack are provided in-situ in the same plasma chamber.

13. The method, as recited in claim 1, wherein plasma from the modification gas etches the second portions of the layer of precursor.

14. A semiconductor device formed by a method for patterning a stack having a mask with a plurality of mask features, the method comprising:
   providing a targeted deposition, wherein the targeted deposition, comprises a plurality of cycles, wherein each cycle comprises:
      flowing a precursor to deposit a layer of precursor; and
      targeted curing the layer of precursor, comprising;
         flowing a curing gas;
         flowing a modification gas;
         forming a plasma from the curing gas and modification gas; and
         exposing the layer of precursor to the plasma providing a targeted curing, wherein plasma from the curing gas cures first portions of the layer of precursor and plasma from the modification gas modifies second portions of the layer of precursor, wherein the modification of the second portion reduces curing of the layer of precursor of the second portions of the layer of precursor; and
   etching the stack through the targeted deposition.

15. The semiconductor device, as recited in claim 14, wherein the precursor deposits at least one of a silicon containing layer or a metal containing layer.

16. The semiconductor device, as recited in claim 15, wherein the curing the first portions of the layer of precursor at least one of oxidizes or nitrogenates the first portions of the layer of precursor.

17. The semiconductor device, as recited in claim 14, wherein the modification gas comprises a halogen containing gas.

18. The semiconductor device, as recited in claim 14, wherein the modification gas comprises at least one of $C_4F_8$, $C_4F_6$, $Cl_2$, HBr, $CF_4$, or $SF_6$.

19. The semiconductor device, as recited in claim 14, wherein the precursor comprises a silicon containing polymer.

20. The semiconductor device, as recited in claim 14, wherein plasma from the modification gas etches the second portions of the layer of precursor.

* * * * *